United States Patent
Lee et al.

(10) Patent No.: US 9,515,144 B2
(45) Date of Patent: Dec. 6, 2016

(54) FIN-TYPE GRAPHENE DEVICE

(71) Applicant: Samsung Electronics Co., Ltd., Suwon-si, Gyeonggi-do (KR)

(72) Inventors: Minhyun Lee, Yongin-si (KR); Jaeho Lee, Seoul (KR); Jin-seong Heo, Suwon-si (KR); Kiyoung Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/747,243

(22) Filed: Jun. 23, 2015

(65) Prior Publication Data

US 2016/0087042 A1  Mar. 24, 2016

(30) Foreign Application Priority Data

Sep. 23, 2014 (KR) .................. 10-2014-0127192

(51) Int. Cl.
*H01L 29/16* (2006.01)
*H01L 29/786* (2006.01)
*H01L 29/423* (2006.01)
*H01L 29/778* (2006.01)
*H01L 29/06* (2006.01)
*H01L 29/165* (2006.01)
*H01L 29/417* (2006.01)

(52) U.S. Cl.
CPC ....... *H01L 29/1606* (2013.01); *H01L 29/0665* (2013.01); *H01L 29/165* (2013.01); *H01L 29/42356* (2013.01); *H01L 29/778* (2013.01); *H01L 29/78642* (2013.01); *H01L 29/78684* (2013.01); *H01L 29/78696* (2013.01); *H01L 29/41775* (2013.01)

(58) Field of Classification Search
CPC .......................... H01L 29/1606; H01L 29/45
See application file for complete search history.

(56) References Cited

U.S. PATENT DOCUMENTS

| | | |
|---|---|---|
| 8,304,760 B2 | 11/2012 | Chen et al. |
| 8,487,296 B2 | 7/2013 | Grebel et al. |
| 8,641,915 B2 | 2/2014 | Kim et al. |
| 8,642,410 B2 | 2/2014 | Hayashi et al. |
| 8,673,683 B2 | 3/2014 | Adkisson et al. |
| 2011/0303899 A1 | 12/2011 | Padhi et al. |
| 2012/0261643 A1* | 10/2012 | Cohen .................. B82Y 10/00 257/27 |

FOREIGN PATENT DOCUMENTS

| | | |
|---|---|---|
| KR | 101219769 B1 | 1/2013 |
| KR | 101221581 B1 | 1/2013 |

* cited by examiner

*Primary Examiner* — Matthew Reames
(74) *Attorney, Agent, or Firm* — Harness, Dickey & Pierce, P.L.C.

(57) ABSTRACT

Example embodiments relate to a fin-type graphene device. The fin-type graphene device includes a substrate, a graphene channel layer substantially vertical to the substrate, a gate insulating layer that covers one side surface of the graphene channel layer, a gate electrode on the gate insulating layer, and a source electrode and a drain electrode that are formed separately from each other on other side surface of the graphene channel layer.

17 Claims, 11 Drawing Sheets

FIN-TYPE GRAPHENE DEVICE

RELATED APPLICATION

This application claims the benefit of priority from Korean Patent Application No. 10-2014-0127192, filed on Sep. 23, 2014, in the Korean Intellectual Property Office, the disclosure of which is incorporated herein in its entirety by reference.

BACKGROUND

1. Field

Example embodiments relate to fin-type graphene devices.

2. Description of the Related Art

In order to manufacture large area graphene, generally, graphene is deposited on a metal catalyst, such as Cu or Ni. In order to use graphene manufactured in this manner, graphene is typically transferred onto a target substrate. During the process of transferring the graphene, a polymer material may be used as a supporter.

However, during the process of removing the polymer material from the graphene after transfer thereof, the quality of graphene may be reduced. Also, the characteristics of graphene may be lowered due to an interaction between an insulating layer on the target substrate and the transferred graphene.

In addition, when the metal catalyst used in the process of manufacturing graphene is removed, graphene may be damaged.

SUMMARY

Example embodiments relate to fin-type graphene devices using graphene on a metal catalyst "as is."

Additional example embodiments will be set forth in part in the description which follows and, in part, will be apparent from the description, or may be learned by practice of the example embodiments.

According to an example embodiment, a graphene device includes a substrate, a graphene channel layer that is vertical to the substrate, a gate insulating layer that covers one side surface of the graphene channel layer, a gate electrode on the gate insulating layer, and a source electrode and a drain electrode that are formed separately from each other on other side surface of the graphene channel layer.

The graphene channel layer may include a horizontal unit on a top part thereof, the horizontal unit horizontally extends with respect to the substrate in a direction of the other side surface of the graphene channel layer, wherein the gate insulating layer and the gate electrode overlap the horizontal unit.

The source electrode and the drain electrode may each be formed of or include a catalyst metal for growing graphene.

Each of the source electrode and the drain electrode may include Cu, Fe, Ni, Co, Pt, Ir, Pd, or Ru.

The graphene channel layer may have a height less than 10 nm, and the graphene device may be or include a graphene field effect transistor.

The gate insulating layer may include an extension unit that extends on the substrate from a bottom part of the gate insulating layer in a direction opposite to the graphene channel layer.

The graphene channel layer may be oriented at an angle in a range from about 60° to about 90° with respect to the substrate.

The graphene device may further include a second gate insulating layer on the substrate to cover the gate insulating layer and the other side surface of the graphene channel layer; a second gate electrode on the second gate insulating layer, and a via metal that is formed in the second gate insulating layer to electrically connect the gate electrode and the second gate electrode.

The graphene device may further include a second gate insulating layer that covers the gate insulating layer and the other side surface of the graphene channel layer on the substrate, wherein the gate electrode covers the second gate insulating layer.

According to another example embodiment, a graphene device includes a substrate, a graphene layer that is vertical to the substrate, a gate insulating layer that covers one side surface of the graphene layer, a gate electrode on the gate insulating layer, a source electrode and a drain electrode that are separately formed from each other on the other side surface of the graphene layer; and a semiconductor layer on the other side surface of the graphene layer to face the gate electrode and to contact the drain electrode, wherein the graphene layer is separated from the drain electrode by a first gap.

According to another example embodiment, a graphene device includes a substrate, a graphene layer that is vertical to the substrate, a gate insulating layer that covers one side surface of the graphene layer; a gate electrode on the gate insulating layer, a source electrode and a drain electrode that are separately formed from each other on other side surface of the graphene layer, a tunneling layer on the other side surface of the graphene layer to face the gate electrode, and a metal layer on the tunneling layer to face the graphene layer and to be electrically connected to the drain electrode, wherein the graphene layer is separated from the drain electrode by a first gap.

BRIEF DESCRIPTION OF THE DRAWINGS

These and/or other example embodiments will become apparent and more readily appreciated from the following description, taken in conjunction with the accompanying drawings in which.

DETAILED DESCRIPTION

Figure 1:
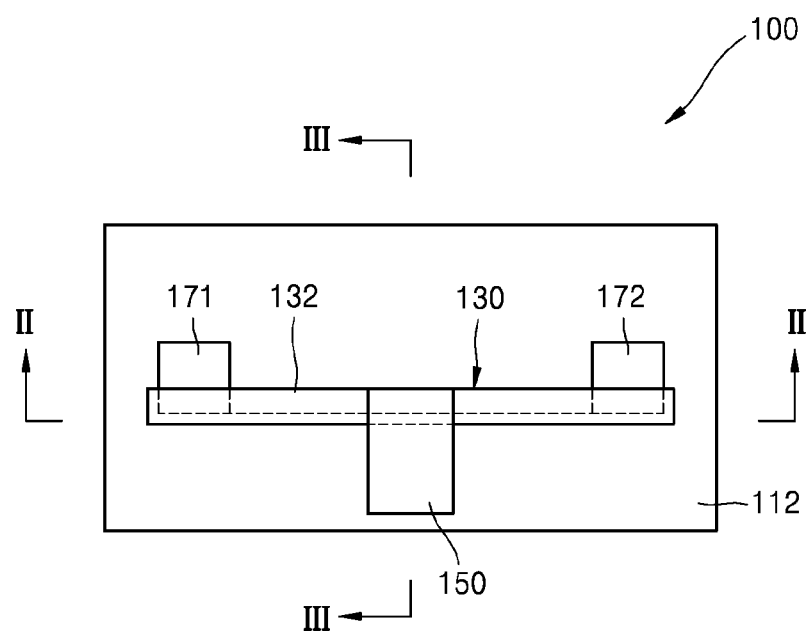
FIG. 1 is a cross-sectional view of a graphene device according to an example embodiment.

Reference will now be made in detail to example embodiments illustrated in the accompanying drawings. In the drawings, the thicknesses of layers and regions are exaggerated for clarity. The example embodiments are capable of various modifications and may be embodied in many different forms.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

Figure 2:
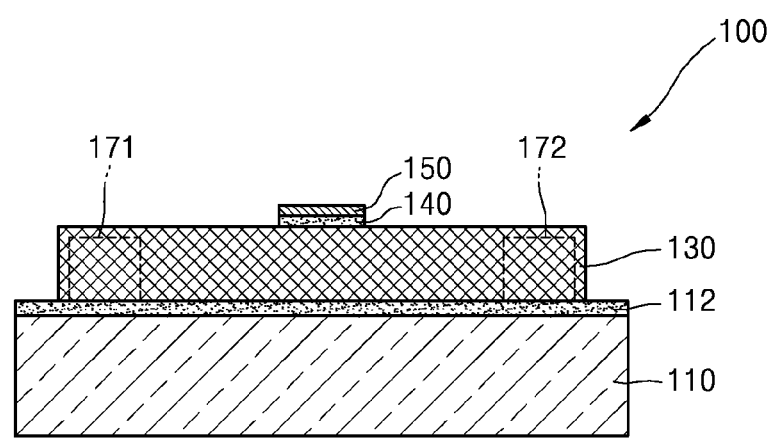
FIG. 2 is a cross-sectional view taken along line II-II of FIG. 1.
Figure 3:
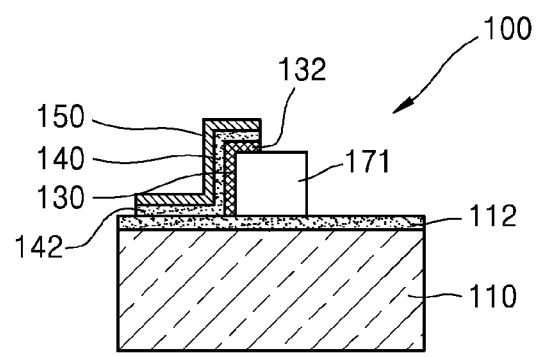
FIG. 3 is a cross-sectional view taken along line III-III of FIG. 1.

FIG. 1 is a cross-sectional view of a graphene device 100 according to an example embodiment. FIG. 2 is a cross-sectional view taken along line II-II of FIG. 1. FIG. 3 is a cross-sectional view taken along line III-III of FIG. 1.

Referring to FIGS. 1 through 3, an insulating layer 112 is formed on a substrate 110. A graphene channel layer 130 is disposed substantially vertically to the substrate 110 on the insulating layer 112. A gate insulating layer 140 and a gate electrode 150 are formed, for example sequentially formed, on the graphene channel layer 130. The gate insulating layer 140 covers one side surface and an upper surface of the graphene channel layer 130, and the other side surface of the graphene channel layer 130 is exposed. The gate electrode 150 covers the gate insulating layer 140 and does not cover the other side surface of the graphene channel layer 130.

A source electrode 171 and a drain electrode 172 are formed on the other side surface of the graphene channel layer 130. Another embodiment of the inventive concept is separately disposed from the gate electrode 150.

The substrate 110 may be a substrate that is generally used in semiconductor processes. For example, the substrate 110 may be formed of or include silicon, glass, or plastic.

The insulating layer 112 may include $SiO_2$, $SiN_x$, $Al_2O_3$, and $HfO_x$ etc. If the substrate 110 is a non-conductive substrate, the insulating layer 112 may be omitted.

The graphene channel layer 130 may have a height approximately less than 10 nm. The graphene channel layer 130 may have a desired, or alternatively predetermined band gap due to a size effect. The graphene channel layer 130 may include approximately 1 through 4 graphene layers.

The height of the graphene channel layer 130 is not limited thereto. For example, the graphene channel layer 130 may have a height greater than a few tens of nm. Accordingly, the graphene channel layer 130 may have a high mobility while having an exposed surface. A transistor that includes the graphene channel layer 130 may be used for an optical sensor, a photoelectric device, etc.

The graphene channel layer 130 may further include a horizontal unit 132 that horizontally extends from a top part of the graphene channel layer 130 to cover the source electrode 171 and the drain electrode 172. The horizontal unit 132 may have a length approximately less than 10 nm.

The gate insulating layer 140 may include $SiO_2$, $SiN_x$, $Al_2O_3$, and $HfO_x$ etc. The gate insulating layer 140 may be formed to cover the horizontal unit 132. The gate insulating layer 140 may be formed to have a thickness in a range from about 5 nm to about 50 nm.

The gate insulating layer 140 may include an extension unit 142 that extends from a bottom part of the gate insulating layer 140 in a direction opposite to the graphene channel layer 130 to cover the insulating layer 112. The extension unit 142 effectively supports the graphene channel layer 130 so that the graphene channel layer 130 is vertically formed.

The gate electrode 150 may be formed to cover the extension unit 142 of the gate insulating layer 140. The gate electrode 150 may be formed to cover the gate insulating layer 140 on the horizontal unit 132 of the graphene channel layer 130.

The gate electrode 150 may be formed of or include a general electrode metal.

The source electrode 171 and the drain electrode 172 may be formed of or include a catalyst metal for growing graphene. For example, the source electrode 171 and the drain electrode 172 may include a metal, for example, Cu, Fe, Ni, Co, Pt, Ir, Pd, Ru, or an alloy of these metals.

The source electrode 171 and the drain electrode 172 may be formed as high as a lower surface of the horizontal unit 132 of the graphene channel layer 130.

As the graphene device 100 includes the graphene channel layer 130 having an exposed side surface, the graphene device 100 may have increased mobility.

FIGS. 4A through 4G are perspective views for explaining a method of manufacturing the graphene device according to an example embodiment. Like reference numerals are used to indicate elements that are substantially identical to the elements of FIGS. 1 through 3, and thus the detailed description thereof will not be repeated.

Figure 4A:
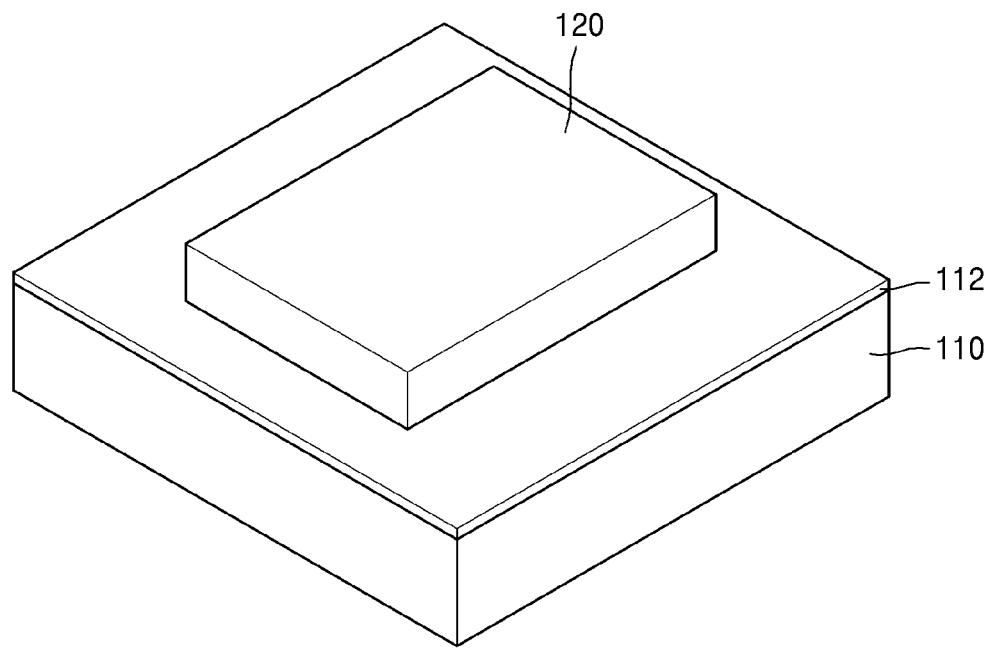
FIGS. 4A through 4G are perspective views for explaining a method of manufacturing a graphene device according to an example embodiment.

Referring to FIG. 4A, a substrate 110 is prepared. The substrate 110 may be a substrate generally used in semiconductor processes. For example, the substrate 110 may be formed of or include silicon, glass, plastic, etc.

A first insulating layer 112 may be formed on the substrate 110. The first insulating layer 112 may include $SiO_2$, $SiN_x$, $Al_2O_3$, and $HfO_x$ etc. If the substrate 110 is non-conductive substrate, the first insulating layer 112 may be omitted.

A catalyst layer 120 may be formed on the first insulating layer 112. The catalyst layer 120 may be formed by patterning a catalyst material after depositing the catalyst material on the first insulating layer 112. The catalyst layer 120 may include a metal, for example, Cu, Fe, Ni, Co, Pt, Ir, Pd, Ru, or an alloy of these metals. The catalyst layer 120 may have a height substantially equal to that of a graphene channel layer 130 which will be described below.

Figure 4B:
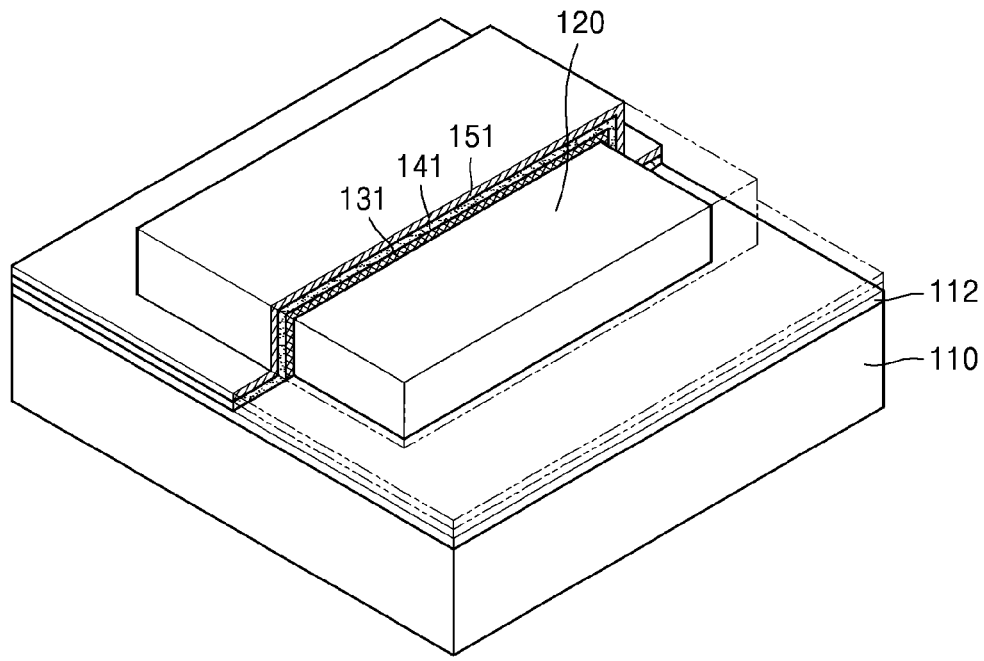

FIG. 4B is a partial perspective view of the resultant product. Referring to FIG. 4B, a graphene layer 131 covering the catalyst layer 120 is deposited on the first insulating layer 112. The graphene layer 131 may be formed by using a chemical vapor deposition (CVD) method and may include 1 through 4 graphene layers.

A second insulating layer 141 is deposited on the graphene layer 131. The second insulating layer 141 may include $SiO_2$, $SiN_x$, $Al_2O_3$, and $HfO_x$ etc. The second insulating layer 141 may be formed by using an atomic layer deposition (ALD) method that has good step coverage. The second insulating layer 141 may be formed to have a thickness in a range from about 5 nm to about 50 nm.

Next, a gate electrode material 151 is deposited on the second insulating layer 141. The gate electrode material 151 may be formed of or include a general metal, for example, Al, Ru, etc. The gate electrode material 151 may be formed by using an ALD method. The gate electrode material 151 may be formed to have a thickness in a range from about 30 nm to about 100 nm.

Figure 4C:
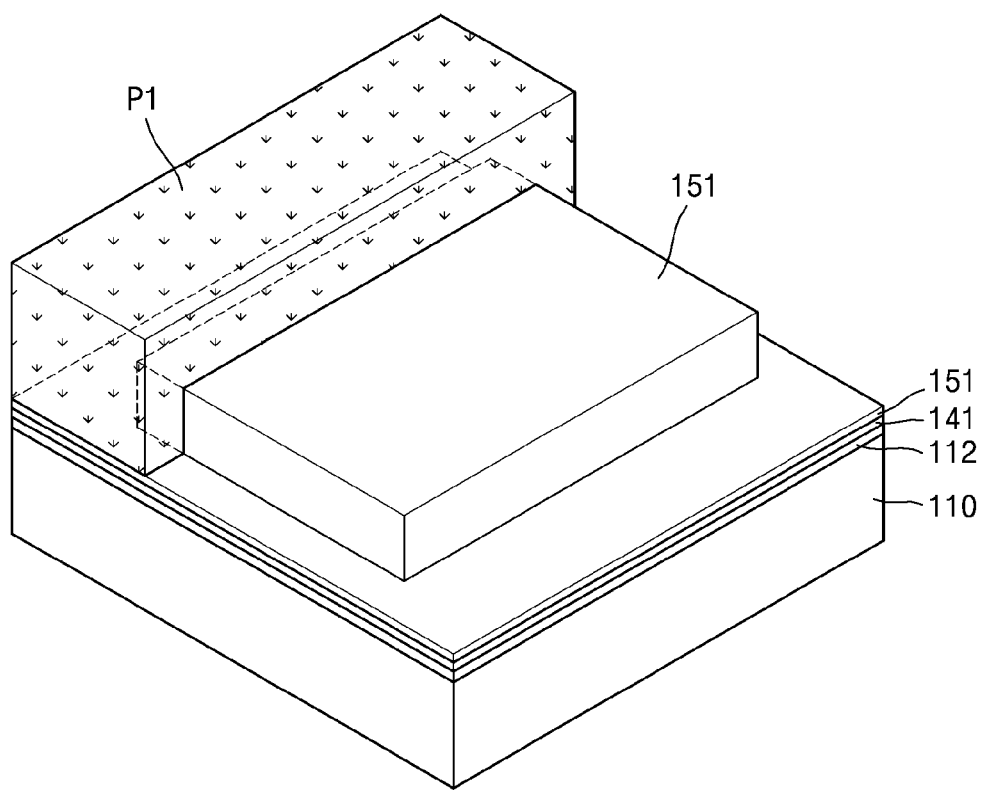

Referring to FIG. 4C, a photoresist P1 is formed in a region where the graphene device is formed.

Figure 4D:
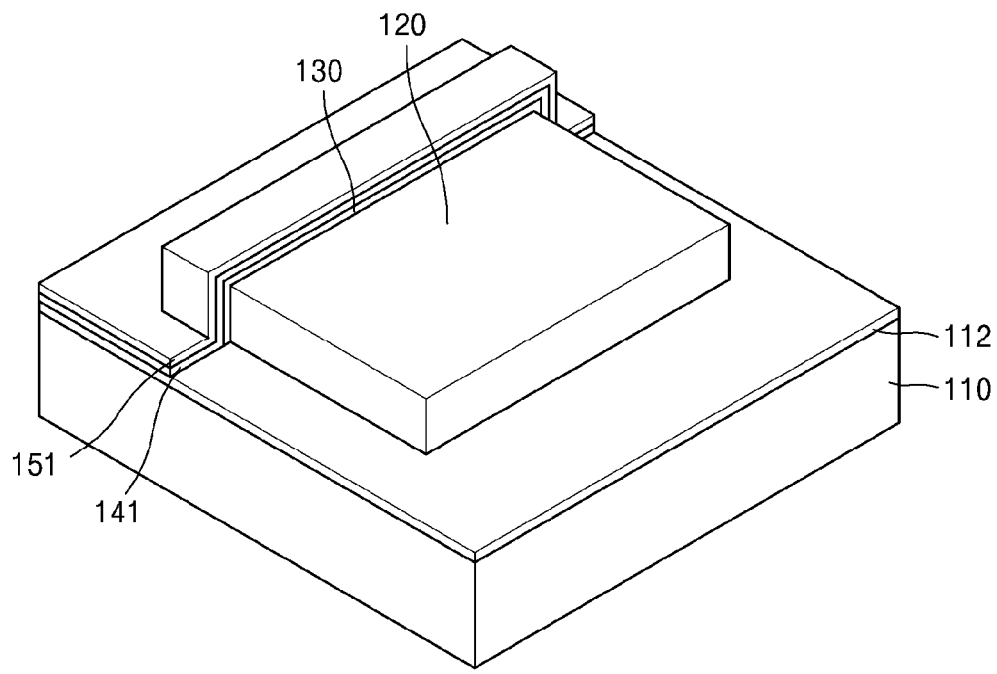

Referring to FIG. 4D, the gate electrode material 151, the second insulating layer 141, and the graphene layer 131 that are exposed by the photoresist P1 are sequentially etched by using a dry etching method. A portion or entire of the catalyst layer 120 that is exposed by the photoresist P1 may be etched. The patterned graphene layer 131 corresponds to the graphene channel layer 130 of FIGS. 1 through 3.

Next, the photoresist P1 is removed.

Figure 4E:
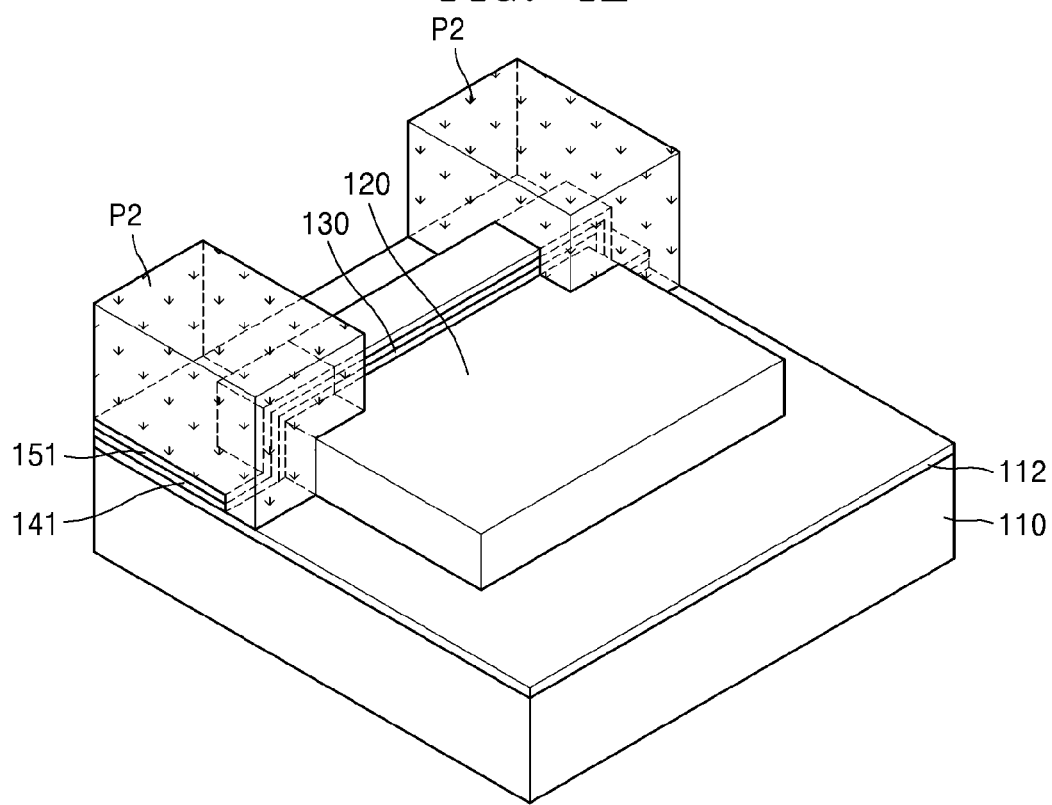

Referring to FIG. 4E, a photoresist P2 is formed in a region where a source electrode and a drain electrode are formed.

Figure 4F:
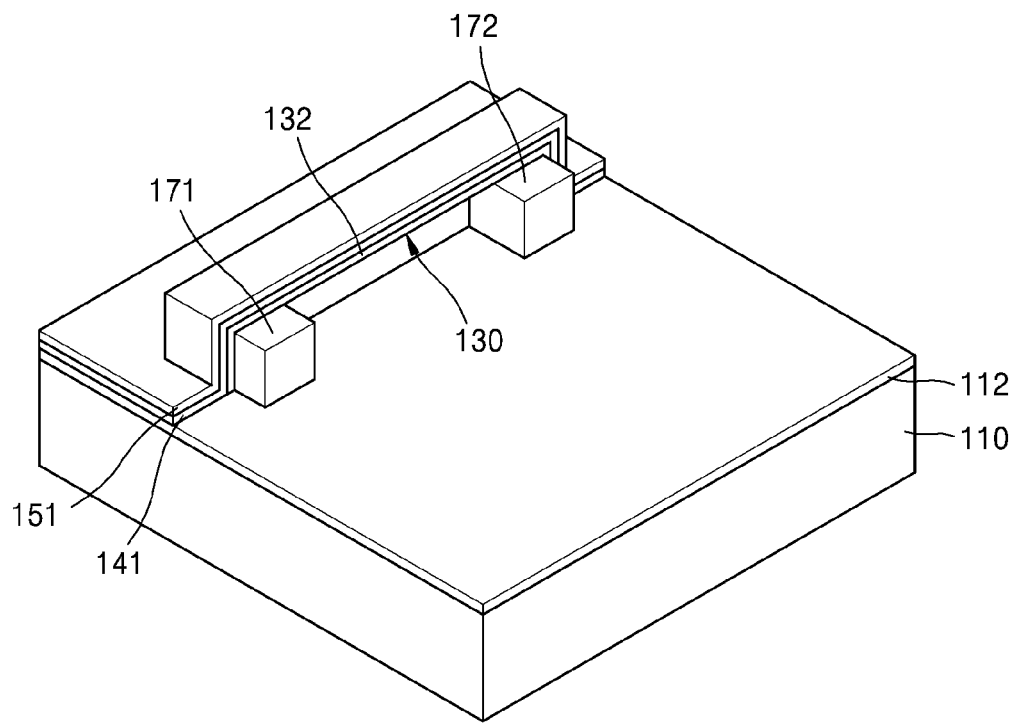

Referring to FIG. 4F, the catalyst layer 120 that is exposed by the photoresist P2 is removed by using a wet etching method. The catalyst layer 120 that remains under the photoresist P2 corresponds to the source electrode 171 and the drain electrode 172. Next, the photoresist P2 is removed.

The graphene layer 130 may include a horizontal unit 132 that extends to cover the catalyst layer 120 from a top part of the graphene layer 130.

Figure 4G:
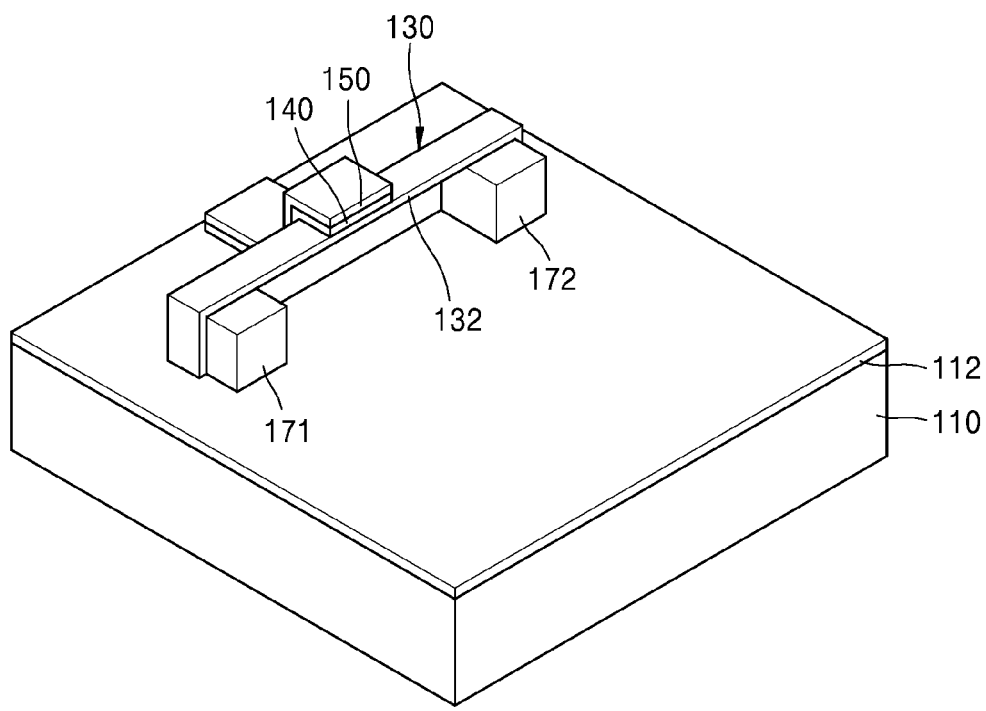

Referring to FIG. 4G, a gate electrode 150 is formed by patterning the gate electrode material 151. In this process, the second insulating layer 141 may be patterned together with the gate electrode material 151 to form a gate insulating layer 140. The gate insulating layer 140 corresponds to the gate insulating layer 140 of FIGS. 1 through 3.

Figure 5:
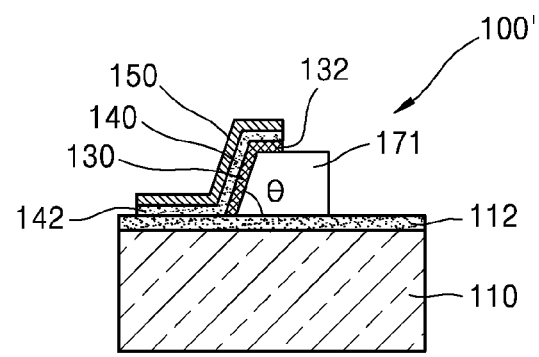
FIG. 5 is a cross-sectional view of a structure of a graphene device according to another example embodiment.

FIG. 5 is a cross-sectional view of a structure of a graphene device 100' according to another example embodiment. Like reference numerals are used to indicate elements that are substantially identical to the elements of FIGS. 1 through 3, and thus the detailed description thereof will not be repeated.

Referring to FIG. 5, a graphene channel layer 130 is slantingly formed at a desired, or alternatively predetermined angle θ with respect to a substrate 110. For example, the graphene channel layer 130 may be slanted at an angle in a range from about 60° to about 90° with respect to the substrate 110. The remaining structure may be substantially the same as the structure of FIGS. 1 through 3, and thus, the description thereof will not be repeated.

The graphene device 100' of FIG. 5 may be used as an optical sensor or a photoelectric device since the graphene device 100' has a high absorption rate of incident light at a desired, or alternatively predetermined inclination angle with respect to the substrate 110.

In order to manufacture the graphene device 100' of FIG. 5, the catalyst layer 120 is formed on the insulating layer 112. However, a side surface of the catalyst layer 120 is slantingly formed at a desired, or alternatively predetermined angle. For this purpose, a thermal flowing process for annealing the patterned catalyst layer 120 may be used. As another method, in a process of patterning the catalyst layer 120, etching may be performed to make the catalyst layer 120 slant, and thus, the catalyst layer 120 having a side surface that is slanted at a desired angle may be formed. The remaining processes may be substantially the same as the processes of manufacturing the graphene device 100, and thus, the descriptions thereof will not be repeated.

Figure 6:
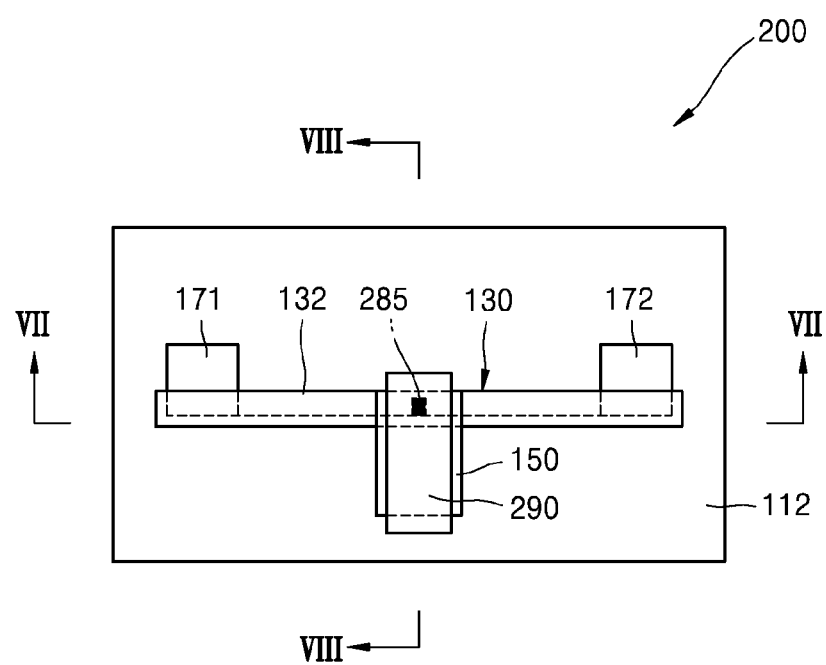
FIG. 6 is a cross-sectional view of a graphene device according to another example embodiment.
Figure 7:
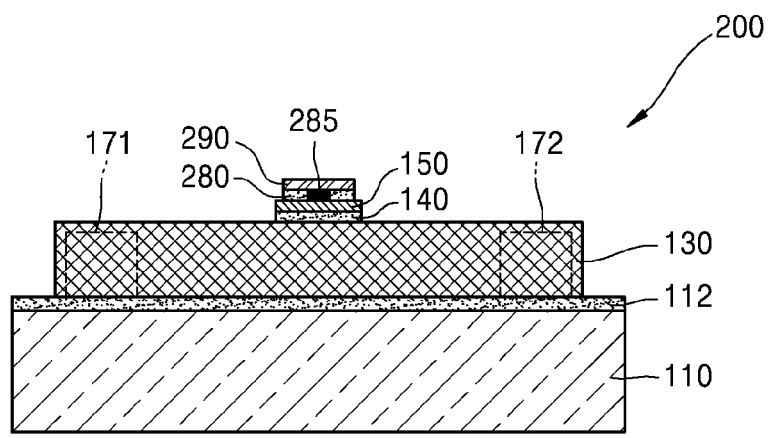
FIG. 7 is a cross-sectional view taken along line VII-VII of FIG. 6.
Figure 8:
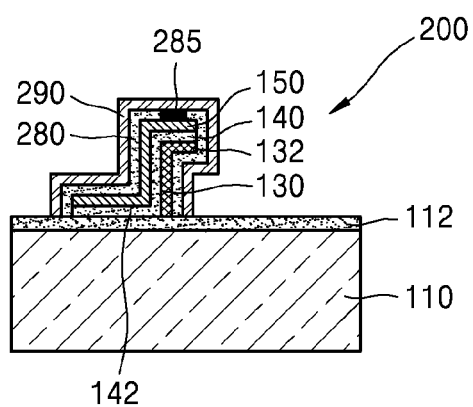
FIG. 8 is a cross-sectional view taken along line VIII-VIII of FIG. 6.

FIG. 6 is a cross-sectional view of a graphene device 200 according to another example embodiment. FIG. 7 is a cross-sectional view taken along line VII-VII of FIG. 6. FIG. 8 is a cross-sectional view taken along line VIII-VIII of FIG. 6. Like reference numerals are used to indicate elements that are substantially identical to the elements of FIGS. 1 through 3, and thus the detailed description thereof will not be repeated.

Referring to FIGS. 6 through 8, an insulating layer 112 is formed on a substrate 110. A graphene channel layer 130 is disposed substantially vertically to the substrate 110 on the insulating layer 112. A first gate insulating layer 140 and a first gate electrode 150 are sequentially formed on the graphene channel layer 130. The first gate insulating layer 140 covers one side surface and an upper surface of the graphene channel layer 130. The first gate electrode 150 covers the first gate insulating layer 140.

A source electrode 171 and a drain electrode 172 are formed on other side surface of the graphene channel layer 130. The source electrode 171 and the drain electrode 172 are separated from the first gate electrode 150.

A second gate insulating layer 280 covering the first gate electrode 150 is formed on the insulating layer 112. The second gate insulating layer 280 also covers the other side surface of the graphene channel layer 130. A second gate electrode 290 is formed on the second gate insulating layer 280.

The first gate electrode 150 and the second gate electrode 290 are electrically connected to each other. A via metal 285 that connects the first gate electrode 150 and the second gate electrode 290 may be formed in the second gate insulating layer 280.

The substrate 110 may be a substrate generally used in a semiconductor process. For example, the substrate 110 may be formed of or include silicon, glass, plastic, etc.

The insulating layer 112 may include $SiO_2$, $SiN_x$, $Al_2O_3$, and $HfO_x$ etc. If the substrate 110 is a non-conductive substrate, the insulating layer 112 may be omitted.

The graphene channel layer 130 may have a height of approximately less than 10 nm. The graphene channel layer 130 may have a desired, or alternatively predetermined band gap due to a size effect. The graphene channel layer 130 may include approximately 1 through 4 graphene layers.

The height of the graphene channel layer 130 is not necessarily limited thereto. For example, the graphene channel layer 130 may have a height greater than a few tens of nm. Accordingly, the graphene channel layer 130 may have a high mobility while having an exposed surface. A transistor that includes the graphene channel layer 130 may be used as an optical sensor or a photoelectric device, etc.

The graphene channel layer 130 may further include a horizontal unit 132 that extends in a horizontal direction on an upper surface of the graphene channel layer 130. The horizontal unit 132 may have a length less than 10 nm.

The first gate insulating layer 140 and the second gate insulating layer 280 may include $SiO_2$, $SiN_x$, $Al_2O_3$, and $HfO_x$ etc. The first gate insulating layer 140 and the second gate insulating layer 280 may be formed to overlap the horizontal unit 132.

The first gate insulating layer 140 and the second gate insulating layer 280 may be formed to have a thickness in a range from about 5 nm to about 50 nm.

The first gate insulating layer 140 may include an extension unit 142 that extends from a bottom part of the first gate insulating layer 140 in a direction opposite to the graphene channel layer 130 to cover the insulating layer 112. The extension unit 142 effectively supports the graphene channel layer 130 so that the graphene channel layer 130 is vertically formed.

The first gate electrode 150, the second gate insulating layer 280, and the second gate electrode 290 may be formed to overlap the extension unit 142 of the first gate insulating layer 140.

The first gate electrode 150 and the second gate electrode 290 may be formed of or include a general electrode material.

The source electrode 171 and the drain electrode 172 may be formed of or include a catalyst metal for growing graphene. For example, the source electrode 171 and the drain electrode 172 may include a metal, for example, Cu, Fe, Ni, Co, Pt, Ir, Pd, Ru, or an alloy of these metals.

The source electrode 171 and the drain electrode 172 may be formed as high as to contact a lower surface of the horizontal unit 132 of the graphene channel layer 130.

In the example embodiment described above, the graphene channel layer 130 is vertically formed. However, the graphene channel layer 130 according to the example embodiment is not limited thereto. For example, the graphene channel layer 130 may be formed to be slanted with an angle in a range from about 60° to about 90° with respect to the substrate 110.

The graphene device 200 according to another example embodiment may be a gate-all-around type transistor and the gate control may further be easy.

The method of manufacturing the graphene device 200 may include forming of the second gate insulating layer 280 on the resultant product of FIG. 4F or FIG. 4G which is a process of manufacturing the graphene device 100, forming of the via metal 285 in the second gate insulating layer 280, and forming of the second gate electrode 290 on the second gate insulating layer 280, and the detailed descriptions thereof will be omitted.

Figure 9:
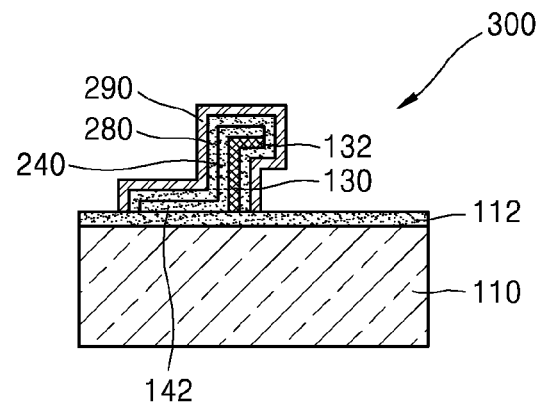
FIG. 9 is a cross-sectional view of a graphene device according to another example embodiment.

FIG. 9 is a cross-sectional view of a graphene device 300 according to another example embodiment. The graphene device 300 has the same structure as the graphene device 200 without including the first gate electrode 150. Like reference numerals are used to indicate elements that are substantially identical to the elements of FIGS. 6 through 8, and thus the detailed description thereof will not be repeated.

Referring to FIG. 9, a second gate insulating layer 280 is formed on a first gate insulating layer 140 to cover the other side surface of the graphene channel layer 130 that is exposed by the first gate insulating layer 140. A second gate electrode 290 is formed on the second gate insulating layer 280. The second gate electrode 290 surrounds the graphene channel layer 130. Accordingly, the graphene device 300 may be a gate-all-around type transistor and the gate control may further be easy.

Forming the first gate electrode 150 may be omitted in the method of manufacturing the graphene device 300. However, the method of manufacturing the graphene device 300 may include forming the second gate insulating layer 280 on the resultant product shown in FIG. 4F or FIG. 4G and forming the second gate electrode 290 on the second gate insulating layer 280. The detailed descriptions thereof will be omitted.

Figure 10:
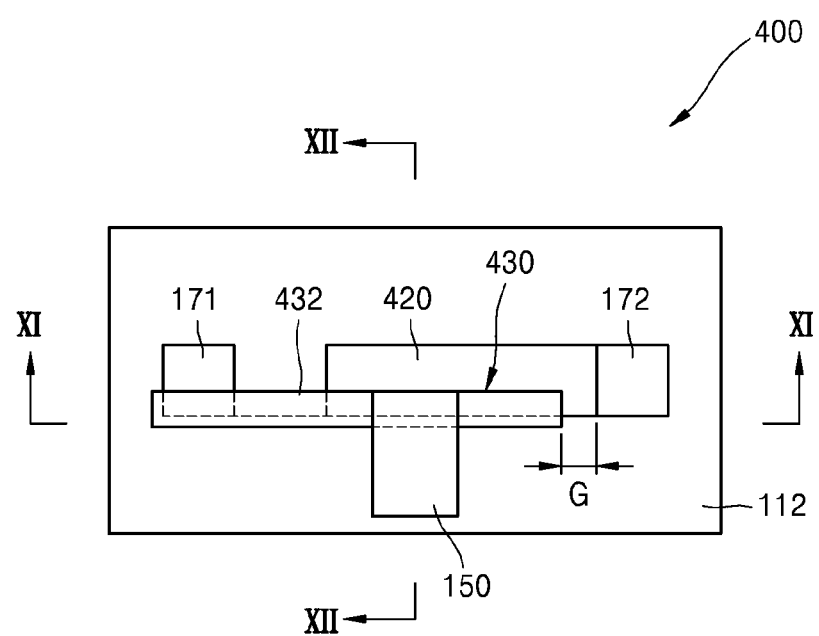
FIG. 10 is a cross-sectional view of a graphene device according to another example embodiment.
Figure 11:
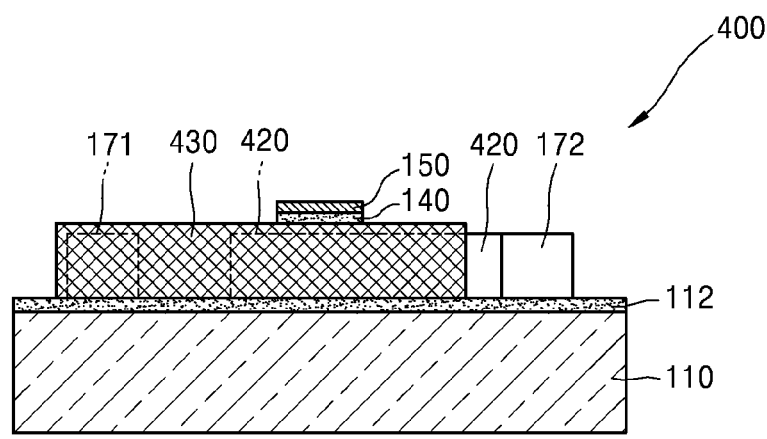
FIG. 11 is a cross-sectional view taken along line XI-XI of FIG. 10.
Figure 12:
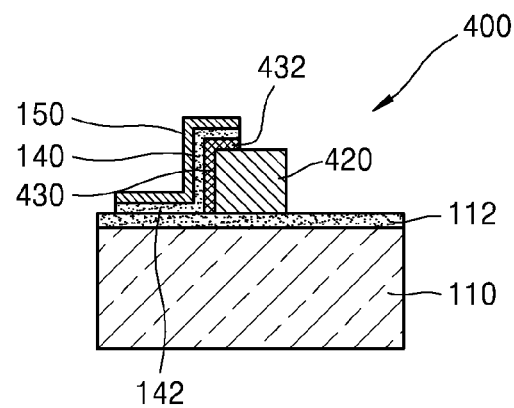
FIG. 12 is a cross-sectional view taken along line XII-XII of FIG. 10.

FIG. 10 is a cross-sectional view of a graphene device 400 according to another example embodiment. FIG. 11 is a cross-sectional view taken along line XI-XI of FIG. 10. FIG. 12 is a cross-sectional view taken along line XII-XII of FIG. 10. Like reference numerals are used to indicate elements that are substantially identical to the elements of FIGS. 1 through 3, and thus the detailed description thereof will not be repeated.

Referring to FIGS. 10 through 12, an insulating layer 112 is formed on a substrate 110. A graphene layer 430 is disposed approximately vertically to a substrate 110 on the insulating layer 112. The graphene layer 430 may further include a horizontal unit 432 that extends in a direction from a top part thereof. The horizontal unit 432 may have a length less than 10 nm. A gate insulating layer 140, and a gate electrode 150 are sequentially formed on the graphene layer 430. The gate insulating layer 140 covers one side surface and an upper surface of the graphene layer 430. Other side surface of the graphene layer 430 is exposed by the gate insulating layer 140.

The gate insulating layer 140 may include an extension unit 142 that extends from a bottom part of the gate insulating layer 140 in a direction opposite to the graphene layer 430. The extension unit 142 effectively supports the graphene layer 430.

The gate electrode 150 covers the gate insulating layer 140 and does not cover the other side surface of the graphene layer 430. The gate electrode 150 may be formed to cover the extension unit 142 of the gate insulating layer 140. Also, the gate electrode 150 may be formed to cover the gate insulating layer 140 on the horizontal unit 432 of the graphene layer 430.

A source electrode 171 and a drain electrode 172 are formed on the other side surface of the graphene layer 430. The source electrode 171 and the drain electrode 172 are separately disposed from each other with the gate electrode 150 therebetween. The source electrode 171 is formed to contact the graphene layer 430, but the drain electrode 172 is separated by a first gap G from the graphene layer 430. The first gap G may be in a range from about 1 nm to about 30 nm.

A semiconductor layer 420 is formed to be in contact with the other side surface of the graphene layer 430. The semiconductor layer 420 is formed to be separated from the source electrode 171, but is formed to contact the drain electrode 172.

The graphene layer 430 may have a height greater than a few tens of nm. The graphene layer 430 is substantially a conductor having a zero band gap. The graphene layer 430 may include approximately 1 through 4 graphene layers.

The source electrode 171 may have a height as high as a lower surface of the horizontal unit 432 of the graphene layer 430. The drain electrode 172 may have the same height as that of the source electrode 171.

The graphene layer 430 is a passage for moving carriers and may have a zero band gap.

The semiconductor layer 420 may be formed of or include silicon, germanium, silicon-germanium, III-V group semiconductor, II-VI group semiconductor, etc. The semiconductor layer 420 may be doped with one of an n-type dopant and a p-type dopant. The semiconductor layer 420 is disposed to face the gate electrode 150 with the graphene layer 430 interposed therebetween. An energy gap of the semiconductor layer 420 may be reduced by a gate voltage. That is, as the gate voltage is increased, the energy gap of the semiconductor layer 420 is reduced, and accordingly, carriers injected through the source electrode 171 move to the semiconductor layer 420 through the graphene layer 430, and finally move to the drain electrode 172.

The graphene device 400 may be a unipolar transistor. The unipolar transistor is an n-type transistor or a p-type transistor according to the polarity of the semiconductor layer 420. That is, when the semiconductor layer 420 is doped with an n-type dopant, the graphene device 400 is an n-type transistor, and when the semiconductor layer 420 is doped with a p-type dopant, the graphene device 400 is a p-type transistor.

In the current embodiment, the graphene layer 430 is vertically formed, but the graphene layer 430 is not limited thereto. For example, the graphene layer 430 may be slantingly formed at an angle in a range from about 60° to about 90° with respect to the substrate 110.

The on/off ratio of the graphene device 400 according to the current embodiment may be increased.

The method of manufacturing the graphene device 400 may further include removing a part of the graphene layer 430 from the resultant product shown in FIG. 4F or FIG. 4G and depositing the semiconductor layer 420, the detailed description thereof will be omitted.

Figure 13:
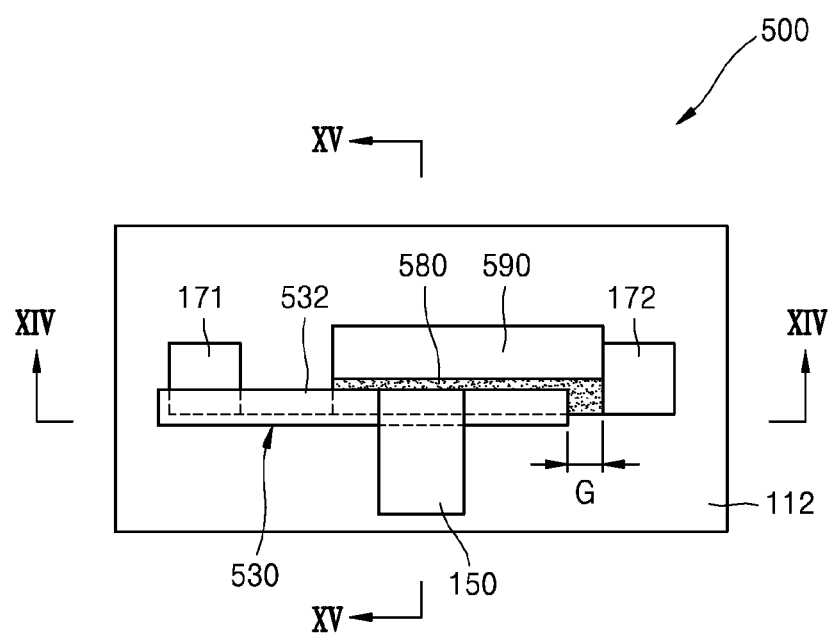
FIG. 13 is a cross-sectional view of a graphene device according to another example embodiment.
Figure 14:
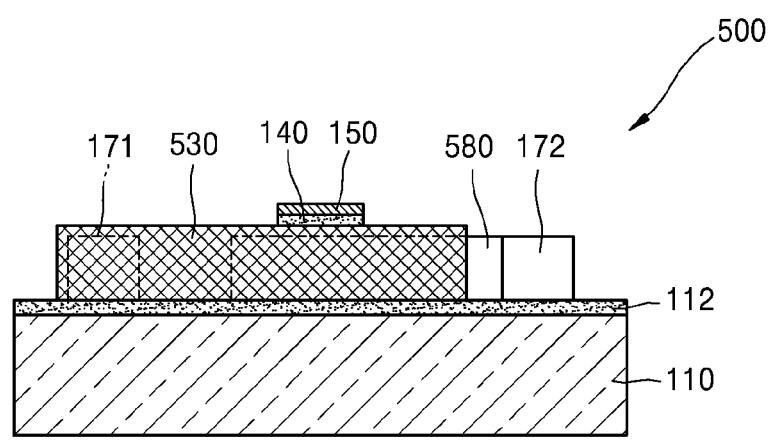
FIG. 14 is a cross-sectional view taken along line XIV-XIV of FIG. 13.
Figure 15:
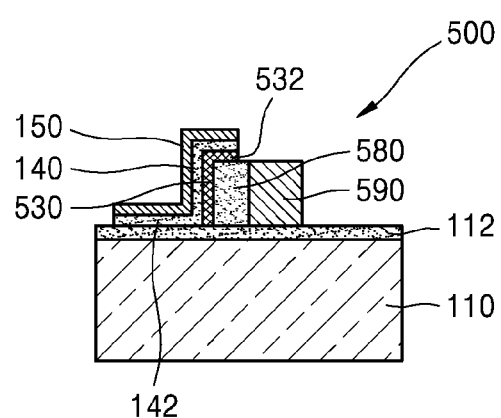
FIG. 15 is a cross-sectional view taken along line XV-XV of FIG. 13.

FIG. 13 is a cross-sectional view of a graphene device 500 according to another example embodiment. FIG. 14 is a cross-sectional view taken along line XIV-XIV of FIG. 13. FIG. 15 is a cross-sectional view taken along line XV-XV of FIG. 13. Like reference numerals are used to indicate elements that are substantially identical to the elements of FIGS. 1 through 3, and thus the detailed description thereof will not be repeated.

Referring to FIGS. 13 through 15, an insulating layer 112 is formed on a substrate 110. A graphene layer 530 is disposed substantially vertically to a substrate 110 on the insulating layer 112. The graphene layer 530 may further include a horizontal unit 532 that extends in a direction from a top part thereof. The horizontal unit 532 may have a length less than 10 nm. A gate insulating layer 140 and a gate electrode 150 are sequentially formed on the graphene layer 530. The gate insulating layer 140 covers a side surface and an upper surface of the graphene layer 530, and other side surface of the graphene layer 530 is exposed by the gate insulating layer 140.

The gate insulating layer 140 may include an extension unit 142 that extends from a bottom part of the gate insulating layer 140 in a direction opposite to the graphene layer 530 to cover the insulating layer 112. The extension unit 142 effectively supports the graphene layer 530.

The gate electrode 150 covers the gate insulating layer 140 and does not cover the other side surface of the graphene layer 530. The gate electrode 150 may be formed to cover the extension unit 142 of the gate insulating layer 140. Also, the gate electrode 150 may be formed to cover the gate insulating layer 140 on the horizontal unit 532 of the graphene layer 530.

A source electrode 171 and a drain electrode 172 are formed on the other side surface of the graphene layer 530. The source electrode 171 and the drain electrode 172 are separately disposed from the gate electrode 150. The source electrode 171 is formed to contact the graphene layer 530, but the drain electrode 172 is separated by a first gap G from the graphene layer 530.

A tunneling layer 580 and a metal layer 590 are sequentially formed on the other side surface of the graphene layer 530. The tunneling layer 580 prevents the metal layer 590 from contacting the graphene layer 530. The metal layer 590 is formed to contact the drain electrode 172.

The graphene layer 530 may have a height greater than a few tens of nm. The graphene layer 530 is substantially a conductor having a zero band gap. The graphene layer 530 may include approximately 1 through 4 graphene layers.

The source electrode 171 may have a height to contact to a lower surface of the horizontal unit 532 of the graphene layer 530. The drain electrode 172 may have the same height as that of the source electrode 171.

The tunneling layer 580 may have a band gap that does not allow generation of a field effect by a voltage applied to the gate electrode 150. The tunneling layer 580 may have a thickness that allows generation of a tunneling effect between the graphene layer 530 and the metal layer 590. For example, the tunneling layer 580 may be formed to have a thickness in a range from about 1 nm to about 30 nm.

The tunneling layer 580 may be formed of or include an oxide or a semiconductor material. For example, the tunneling layer 580 may be formed of or include GIZO, a-Si, Si, HIZO, MoS2, CdSe, ZnO, AlP, InP, SrTiO3, Ge, GaAs, SiC, AlAs, GaN, CdTe, CuO, NiO, or GaMnAs.

When a turn-on voltage is applied to the gate electrode 150 when a desired, or alternatively predetermined voltage is applied to the source electrode 171 and the drain electrode 172, carriers injected through the source electrode 171 are moved to the graphene layer 530. The carriers may move to the metal layer 590 due to a tunneling effect at an energy band junction portion between the graphene layer 530 and the tunneling layer 580, and the carriers that are moved to the metal layer 590 are moved to the drain electrode 172.

In another example embodiment, the graphene layer 530 is vertically formed, but the graphene layer 530 is not limited thereto. For example, the graphene layer 530 may be slantingly formed at an angle in a range from about 60° to about 90° with respect to the substrate 110.

The on/off ratio of the graphene device 500 according to another example embodiment may be increased.

The method of manufacturing the graphene device 500 may further include removing a part of the graphene layer 530 from the resultant product shown in FIG. 4F or FIG. 4G and depositing the tunneling layer 580 and the metal layer 590 on, the detailed description thereof will be omitted.

While one or more example embodiments have been described with reference to the appended figures, it will be understood by those of ordinary skill in the art that various changes in form and details may be made therein without departing from the spirit and scope as defined by the following claims.

What is claimed is:

1. A graphene device comprising:
   a substrate;
   a graphene channel layer substantially perpendicular to a longitudinal surface of the substrate;
   a gate insulating layer substantially covering only one side surface of the graphene channel layer;
   a gate electrode on the gate insulating layer; and
   a source electrode and a separate drain electrode from the source electrode, the source electrode and the separate drain electrode only on an other side surface of the graphene channel layer.

2. The graphene device of claim 1, wherein the graphene channel layer comprises a horizontal unit on a top part thereof, the horizontal unit extending substantially parallel to the longitudinal surface of the substrate in a direction of the other side surface of the graphene channel layer, and
   wherein the gate insulating layer and the gate electrode overlap the horizontal unit.

3. The graphene device of claim 2, wherein the source electrode and the drain electrode each comprise a catalyst metal for growing graphene.

4. The graphene device of claim 1, wherein at least one of the source electrode and the drain electrode comprises Cu, Fe, Ni, Co, Pt, Ir, Pd, or Ru.

5. The graphene device of claim 1, wherein the graphene channel layer has a height less than about 10 nm, and the graphene device is a graphene field effect transistor.

6. The graphene device of claim 1, wherein the gate insulating layer comprises an extension unit extending on the surface of the substrate in a direction away from the one side surface of the graphene channel layer.

7. The graphene device of claim 1, further comprising:
   a second gate insulating layer on the substrate covering the gate insulating layer and the other side surface of the graphene channel layer;
   a second gate electrode on the second gate insulating layer; and
   a via metal in the second gate insulating layer electrically connecting the gate electrode and the second gate electrode.

8. The graphene device of claim 1, further comprising a second gate insulating layer covering the gate insulating layer and the other side surface of the graphene channel layer on the substrate, wherein the gate electrode covers the second gate insulating layer.

9. A graphene device comprising:
   a substrate;
   a graphene layer substantially perpendicular to a longitudinal surface of the substrate;
   a gate insulating layer substantially covering only one side surface of the graphene layer;
   a gate electrode on the gate insulating layer;
   a source electrode only on an other side surface of the graphene layer and a separate drain electrode from the source electrode; and
   a semiconductor layer on the other side surface of the graphene layer facing the gate electrode and contacting the drain electrode, wherein the graphene layer is separated from the drain electrode by a first gap configured to prevent the graphene layer from electrically contacting the drain electrode.

10. The graphene device of claim 9, wherein the graphene layer comprises a horizontal unit extending from a top part of the graphene layer in a direction parallel to the longitudinal surface of the substrate.

11. The graphene device of claim 9, wherein at least one of the source electrode and the drain electrode comprises a catalyst metal for growing graphene.

12. The graphene device of claim 11, wherein at least one of the source electrode and the drain electrode comprises Cu, Fe, Ni, Co, Pt, Ir, Pd, or Ru.

13. The graphene device of claim 9, wherein the gate insulating layer comprises an extension unit extending on the surface of the substrate in a direction away from the graphene layer.

14. A graphene device comprising:
    a substrate;

a graphene layer substantially perpendicular to a longitudinal surface of the substrate;
a gate insulating layer substantially covering only one side surface of the graphene layer;
a gate electrode on the gate insulating layer;
a source electrode only on an other side surface of the graphene layer and a separate drain electrode from the source electrode;
a tunneling layer on the other side surface of the graphene layer facing the gate electrode; and
a metal layer on the tunneling layer facing the graphene layer and electrically connected to the drain electrode,
wherein the graphene layer is separated from the drain electrode by a first gap configured to prevent the graphene layer from electrically contacting the drain electrode.

15. The graphene device of claim 14, wherein the graphene layer comprises a horizontal unit extending from a top part of the graphene layer in a direction substantially parallel to the longitudinal surface of the substrate.

16. The graphene device of claim 14, wherein at least one of the source electrode and the drain electrode comprises a catalyst metal for growing graphene.

17. The graphene device of claim 14, wherein the gate insulating layer comprises an extension unit extending on the surface of the substrate in a direction away from the one side surface of the graphene layer.

* * * * *